(12) United States Patent
Bergman et al.

(10) Patent No.: US 6,336,032 B1
(45) Date of Patent: Jan. 1, 2002

(54) METHOD AND DEVICE FOR PHASE REGULATION

(75) Inventors: Johan Bergman, Göteborg; Per Löfving, Mölndal; Jan Robert Hedström, Askim; Thorsten Kraus, Billigheim, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/218,618

(22) Filed: Dec. 22, 1998

(30) Foreign Application Priority Data

Dec. 23, 1997 (SE) .................................................. 9704859-9

(51) Int. Cl.[7] .................................................... H01Q 11/12
(52) U.S. Cl. ........................ 455/126; 455/276.1; 455/304
(58) Field of Search ................................ 455/42, 43, 139, 455/276.1, 304, 126, 110, 114, 115, 44, 107, 119

(56) References Cited

U.S. PATENT DOCUMENTS

| | | | | |
|---|---|---|---|---|
| 4,261,056 A | * | 4/1981 | Barnett et al. ................ | 455/139 |
| 5,121,077 A | * | 6/1992 | McGann ........................ | 455/126 |
| 5,175,879 A | * | 12/1992 | Lee et al. ..................... | 455/126 |
| 5,222,246 A | * | 6/1993 | Wolkstein ..................... | 455/304 |
| 5,426,641 A | | 6/1995 | Afrashteh et al. | |
| 5,614,855 A | * | 3/1997 | Lee et al. ..................... | 327/158 |
| 5,802,451 A | * | 9/1998 | Adachi et al. ................ | 455/126 |

FOREIGN PATENT DOCUMENTS

| | | | | |
|---|---|---|---|---|
| GB | 2 240 893 | | 8/1991 | |
| GB | 2240893 A | * | 8/1991 | |
| JP | 6038731 | | 3/1994 | |
| JP | 8008653 | | 1/1996 | |
| JP | 9116474 | | 5/1997 | |
| WO | WO 94/10765 | * | 8/1991 | .............. H04B/7/26 |
| WO | 94/10765 | | 5/1994 | |
| WO | 96/30997 | | 10/1996 | |
| WO | 97/28598 | | 8/1997 | |

* cited by examiner

*Primary Examiner*—William Trost
*Assistant Examiner*—Tilahun Gesesse
(74) *Attorney, Agent, or Firm*—Burns, Doane, Swecker & Mathis L.L.P

(57) ABSTRACT

The phase of a transmitted signal is regulated in a device which is part of a system for electromagnetic signal transmission. The transmitted signal has periods when it contains information and periods when it does not contain information. The modulation position of a phase shifter which has a linear and a non-linear range is controlled. Power of the signal is amplified. Unwanted phase shifts in the signal transmitted by the device caused within the power amplifier are detected, and the information content of the signal is detected. The phase shifter is reset to a particular predetermined modulation position in the event of detection of the absence of information in the signal. The predetermined modulation position to which the phase shifter is reset is preferably situated within the linear range of the phase shifter.

12 Claims, 2 Drawing Sheets

METHOD AND DEVICE FOR PHASE REGULATION

This application claims priority under 35 U.S.C. §§119 and/or 365 to 9704859-9 filed in Sweden on Dec. 23, 1997; the entire content of which is hereby incorporated by reference.

TECHNICAL FIELD

This invention relates to a method and a device for regulating the transmitted phase of a signal in an antenna device.

BACKGROUND

Within systems based on electromagnetic signal transmission, for example radar systems and systems for wireless communication, phase-controlled antennas are a technique which has many advantages. These advantages include the fact that phase-controlled antennas greatly increase the ability to adaptively vary the directivity of an antenna, which for example makes it possible to have the antenna's radiation diagram, the antenna beam, follow a moving object without mechanical movement of the antenna.

As the directivity of a phase-controlled antenna can be varied adaptively, it is possible in a system for wireless communication, for example a mobile telephone system, to direct the antenna beam towards only those directions where there are subscribers at the moment. In this way, the total transmitted power can be reduced while at the same time maintaining communication with all the subscribers in the system.

Because of the ability to vary the directivity of phase-controlled antennas, it is also possible, using a mass-produced phase-controlled antenna, to individually design the antenna's coverage depending upon the topography of the area in which the antenna is located. For example, antennas which are located along motorways can be given a main coverage which coincides with the lengthways extent of the road and antennas which are placed at intersections can be given a main coverage which coincides with the extent of the intersection.

A phase-controlled antenna is normally formed of a large number of antenna elements whose antenna beams together form the resultant antenna beam of the phase-controlled antenna. The resultant antenna beam is controlled by varying the phase of the signals that are sent out by the antenna elements making up the antenna. In other words, in a phase-controlled antenna it is of the utmost importance that the phase of the signal transmitted by each antenna element is the intended one.

The antenna elements in a phase-controlled antenna often include a phase shifter which causes the signal to assume the required phase, and a power amplifier, PA, connected to the phase shifter, which amplifies the signal. A problem in this context is that the power amplifier can affect the phase of the signal transmitted by the antenna element. These phase shifts in the power amplifier arise, for example, as a result of the temperature in the power amplifier varying, which can occur when the output energy varies.

In other types of antenna than phase-controlled group antennas there can also be power amplifiers which can affect the phase of the signal in an unwanted way. An example of such an antenna is a group antenna which is not phase-controlled, in other words an antenna whose antenna beam is not controlled electronically but where the antenna as a whole still consists of a number of antenna elements. Each antenna element in such a group antenna can include a power amplifier. The phase of the signal which is fed into each antenna element in this type of group antenna may not be affected by the power amplifier.

Phase shifts which arise due to power amplifiers in systems of the type described above can be compensated for by the power amplifier being reconnected to the phase shifter in a control loop. In such a control loop there are means for controlling the phase shifter whereby the phase shifter is made to cause the power amplifier to assume the required phase. A problem in this context is that many types of phase shifter do not have so-called periodic behaviour, in other words the phase shifter only has a certain linear range within which it is required to work. Phase shifters without periodic behaviour should be reset to a working point, a so-called modulation position, within the linear range before the phase shifter has gone outside its linear range.

There is therefore a need at certain times to reset a phase shifter which is part of an antenna element of the types described above to a certain predetermined modulation position. Resetting of phase shifters should not be carried out when the signal transmitted by the antenna element contains information, as the resetting could then affect the transmission of information. An additional requirement is that the modulation position to which the resetting of the phase shifter is carried out should be such that the phase shifter cannot go outside its linear range before the next resetting occasion.

Document WO94/10765 describes a device for linearization of a power amplifier in a mobile telephone system of the TDMA type. The linearization of power amplifiers according to this document can only be carried out at certain predetermined times, so-called linearization time slots. This could be said to result in a rather inflexible system.

Documents U.S. Pat. No. 5,426,641 and JP 9 116 474 describe devices for regulating the phase of the transmitted signal in systems for wireless communication. The devices according to these documents include measuring the phase position or parameters relating to the phase position of the component which exhibits variations in phase, after which measurements calculations are carried out to find out what modulation position the component in question should be reset to. These appear to be rather complex and thus expensive solutions.

SUMMARY

The problem which is solved by the invention is thus to be able to regulate correctly the phase of the signal in a device which is part of a system for electromagnetic signal transmission, preferably an antenna element in an antenna which is part of a system for wireless communication, without the phase regulation having an adverse effect on the transmission of information within the system.

The device which is regulated according to the method preferably comprises a phase shifter which has a linear and a non-linear range, a power amplifier which amplifies the signal from the phase shifter and means for controlling the modulation position of the phase shifter, by which the transmitted signal is given the required phase position.

The above-mentioned problem is solved according to the invention by utilizing advance knowledge of when the transmitted signals contain information and when they do not. At times when the signal does not contain information, the phase shifter is reset to a certain predetermined modulation position, which preferably lies within the linear range of the phase shifter.

In a preferred embodiment the invention is used in a TDMA mobile telephone system of the GSM type.

DESCRIPTION OF THE FIGURES

In the following the invention will be described in greater detail utilizing examples of preferred embodiments and with reference to the attached figures, where.

DETAILED DESCRIPTION

Figure 1:
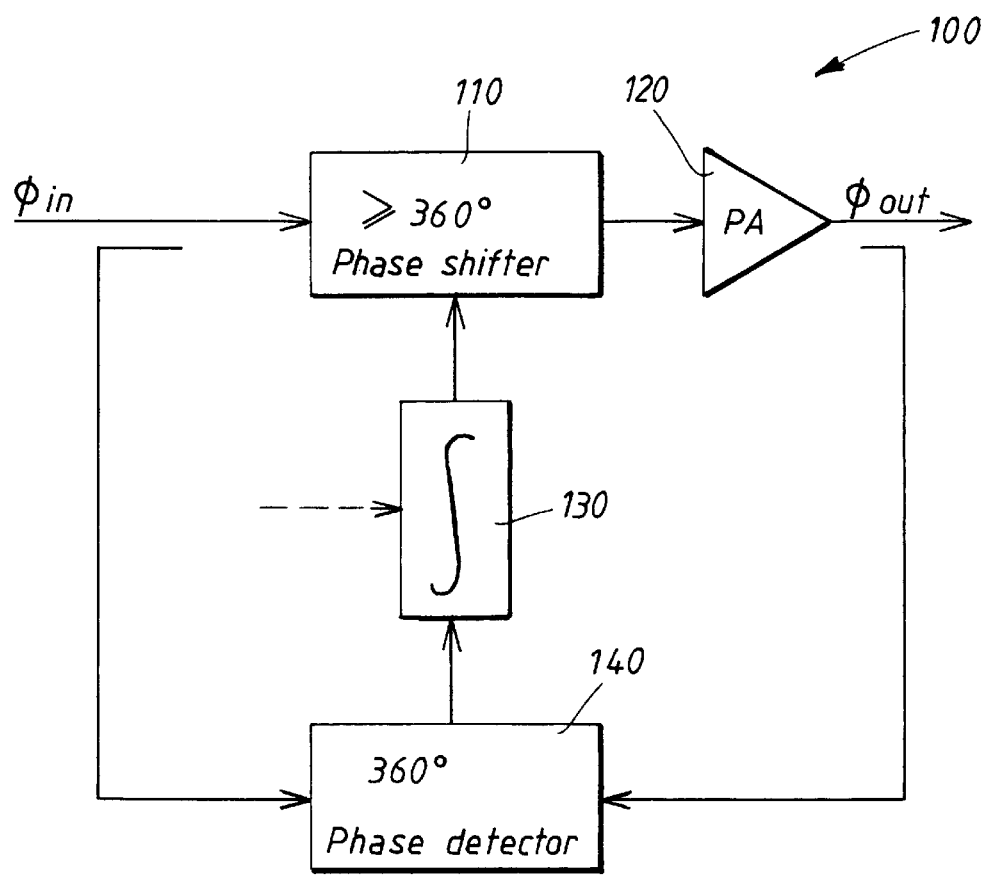
FIG. 1 shows a device in which the invention is used to regulate transmitted phase.

FIG. 1 shows an example of a device 100 in which the invention can be used. The device 100 comprises a phase shifter 110 and a power amplifier 120 connected in series with the phase shifter 110. The phase shifter 110 and the power amplifier 120 are in addition connected to each other in a control loop, which also includes a regulator. In a preferred embodiment the regulator consists of an integrator 130. A phase detector 140 is connected to the integrator 130, but the integrator 130 can also be connected to an external control device, which is shown by a dotted line. in a preferred embodiment the phase shifter 110 consists of one or more varactor diodes, which together form a phase shifter whose linear range suitably exceeds 360°.

The phase detector 140 is preferably connected so as to detect $\phi_{in}$ and $\phi_{out}$ via a (not shown) directional coupler which connects a small part of the signal in question to the phase detector.

The phase detector 140 thus detects the difference between the phase of the input signal to the device, $\phi_{in}$, and the phase of the signal transmitted by the power amplifier 120, $\phi_{out}$. In a preferred embodiment of the invention, the changes in the difference between $\phi_{in}$ and $\phi_{out}$ are used to detect phase shifts in the power amplifier. Detection of phase shifts in the power amplifier should not be carried out by detecting whether $\phi_{in}$ and $\phi_{out}$ have the same value, since for example differences in electrical wavelength, for example different length connections between the phase detector 140 and the above-mentioned directional couplers, can cause different values of $\phi_{in}$ and $\phi_{out}$ at their connection points to the phase detector 140.

However, in the event of constant phase position of the output signal from the power amplifier, the difference between $\phi_{in}$ and $\phi_{out}$ will be constant. In other words, if the difference between $\phi_{in}$ and $\phi_{out}$ is constant, no phase shifts have occurred. Therefore, if the phase detector 140 detects that the difference between $\phi_{in}$ and $\phi_{out}$ has changed, the phase shifter 110 will be regulated via the regulator 130 so that the difference between $\phi_{in}$ and $\phi_{out}$ attains a required constant value.

Figure 2:
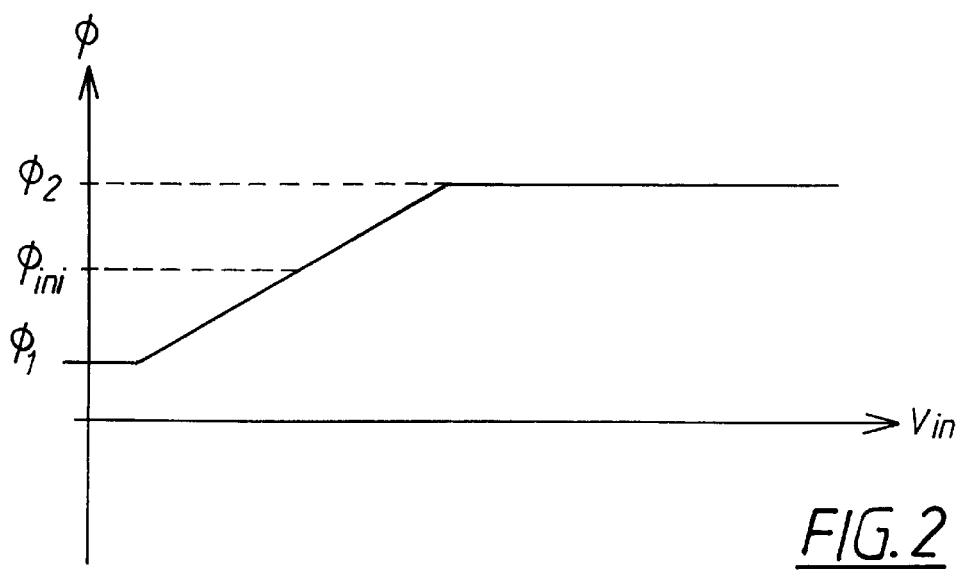
FIG. 2 shows diagrammatically the phase characteristics of a phase shifter with non-periodic behaviour.

FIG. 2 shows the characteristics of a normal type of phase shifter. As shown in the figure, the phase shifter has a linear range, $\phi_1-\phi_2$, within which, in the present case, the phase shifter is required to work. In other words, the modulation position of the phase shifter is required to lie within the linear range. As also shown by FIG. 2, the modulation position of the phase shifter will be outside the linear range if the compensation for the phase deviation of the power amplifier exceeds the difference between the point at which the phase shifter begins to operate and any of the distances to the limits, $\phi_1$, $\phi_2$, of the commencement of the non-linear range.

In order for the modulation position of the phase shifter 110 not to come outside the linear range, according to the invention the phase shifter 110 is reset at certain times to a certain predetermined modulation position $\phi_{in1}$ within the linear range, This resetting should suitably be carried out in such a way that the following conditions are fulfilled:

1. From the modulation position $\phi_{in1}$ to which the phase shifter is reset, the phase shifter must not be able to go outside its linear range before the next resetting takes place.

2. Resetting of the phase shifter should be carried out when no information is being transmitted in the RF signal, in other words the output signal from the power amplifier.

In a preferred embodiment the invention is used in a mobile telephone system of the TDMA type, preferably a GSM system. In the following therefore it is described how the two conditions listed above for resetting the phase shifter 110 are fulfilled in a GSM system.

Figure 3A:
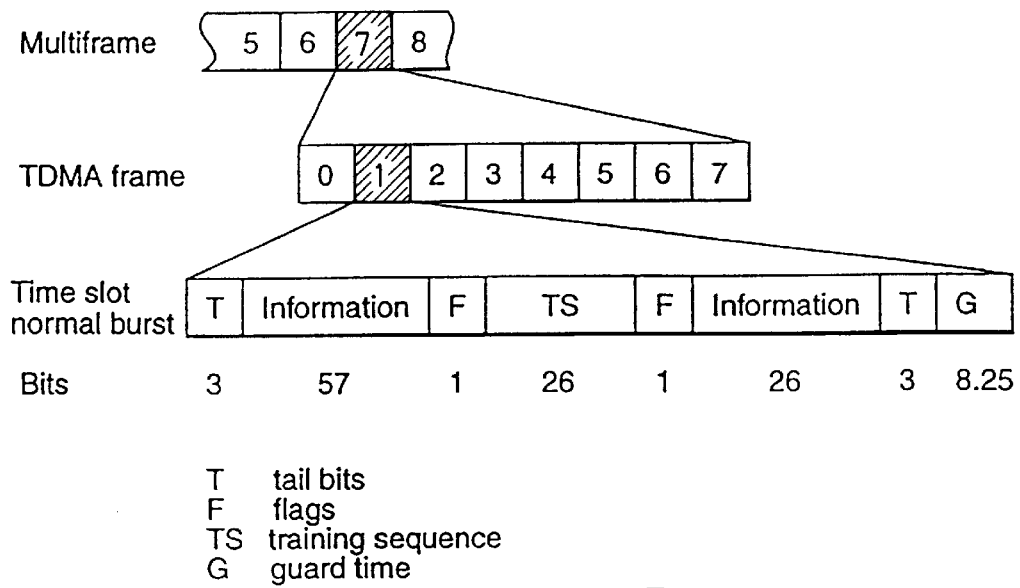
FIGS. 3a and 3b show diagrammatically a "burst" in a GSM system.
Figure 3B:
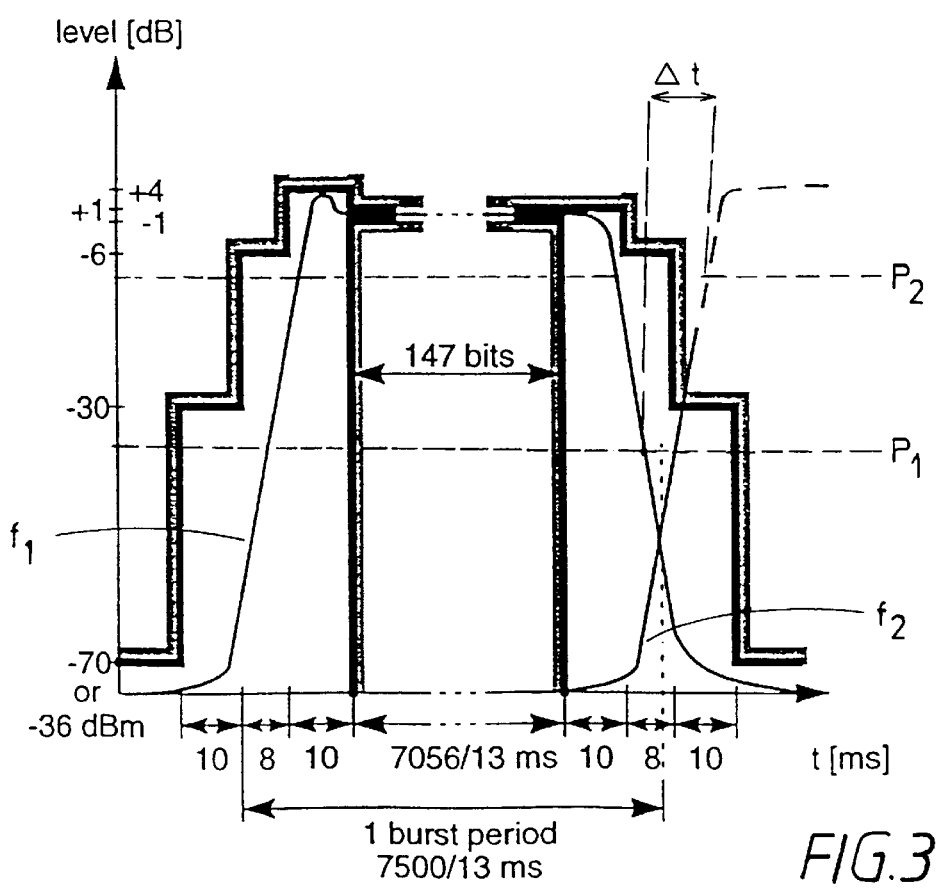

FIGS. 3a and 3b show diagrammatically the construction of the signal and the signal format in a GSM system. During what is known as the guard time at the end of the message ("burst") no information is transmitted in the RF signal. In addition, the power varies during the guard time, first dropping and then rising. FIG. 3b also shows a frequency change, the power of the first frequency $f_1$ is stepped down during the guard time and increased on the frequency $f_2$ which is to be used during the next "burst".

The variation in power during the guard time can thus be used as a sign that no information is being transmitted and that resetting of the phase shifter 110 can therefore be carried out. In addition, the phase variation of the power amplifier 120 is fairly small during that part of a "burst" which is used for transmitting information in the RF signal, as frequency and input power, which are parameters which affect the phase variation of the power amplifier, are kept relatively constant when information is being transmitted in the RF signal. On the other hand, the frequency and the input power can vary during the guard time, which means that the regulation of the power amplifier 120 by the phase shifter 110 is mainly carried out during the guard time. After the guard time there are usually no great phase variations occurring in the device 100. To sum up, in other words detection that the power of a signal has dropped below a certain level $P_1$ is used as an indication that there is a guard time, which means that resetting of the phase shifter can commence.

Resetting of the phase shifter takes up a certain length of time. It is realized that the time for resetting should not exceed the time which passes before the RF signal once again contains information. Suitably, the exceeding of the power level $P_1$ by the signal can be used as an indication that the resetting should have been completed. In an alternative embodiment, the resetting can be "time-controlled". The term "time-controlled" here means that the resetting can be adjusted to always take up the same length of time, as it is known from the system specification etc, how much time will pass before the information starts to be present in the RF signal after a break in the information, in the GSM system between two "bursts".

When resetting is completed, it is permissible for the phase shifter 110 to vary up until the next time for resetting, however, of course controlled by the regulator 130.

In an alternative embodiment of the invention, the fact that the phase variations of the power amplifier 120 mainly occur during the guard time is used in a somewhat different way than that described above. In this alternative embodiment it is assumed that the phase variations of the power amplifier 120 during that part of a "burst" when information is transmitted in the RF signal are negligible in relation to the phase variations during the guard time. Based on this assumption, the modulation position of the phase shifter 110 is reset in the way described above, but the phase shifter is not allowed to vary after the resetting until the next resetting occasion. Instead, the modulation position of the phase shifter 110 is kept constant in one and the same position until the next resetting occasion.

The position in which the phase shifter 140 is kept constant in this alternative embodiment is a position which the phase shifter assumes after the resetting is completed, but before information has started to be transmitted in the RF signal, in other words in the example shown before the guard time ends. In other words, in this embodiment of the invention the time interval for the resetting concluding to the information commencing to be transmitted in the RF signal must be sufficient for regulation of the phase shifter to take place. In FIG. 3b this is shown as a time interval $\Delta t$ between the power level $P_1$ and a second power level $P_2$ which is found immediately before the RF signal begins to contain information, and at which power level $P_2$ "locking" can be carried out.

In the two embodiments of the invention described above, it has been assumed that the device 100 is equipped with means for detecting the variations in power arising in connection with guard time. These means—shown connected to the regulator by a dotted line—can be implemented in a large number of ways well-known to those skilled in the field and are therefore not described in further detail here.

In addition, the device 100 in accordance with the invention can advantageously be equipped with means for controlling the regulation process. These means can then be connected to the regulator at the above-mentioned dotted line. Also, such means for controlling the regulation process can be implemented in a large number of ways well-known to those skilled in the field and are therefore not described in greater detail here.

Controlling of the control process in connection with resetting can also be carried out by the phase shifter 110 for a certain predetermined time being reset to one and the same position. This period of time should then be so adjusted that it corresponds to the time between the resetting commencing and the time when regulation of the phase shifter to a required constant position has been able to be carried out, suitably a time before information starts to be transmitted in the RF signal. It is also possible that the position to which the phase shifter is reset can vary between the resetting occasions.

In addition, it is the case that the detection of the guard time and different positions during the guard time are used as an indication that information is not being transmitted in the RF signal. This detection that information is not being transmitted in the RF signal can also be carried out in other ways. For example, it is possible that the means for detecting variations in power of the signal can be replaced by a connection to the system, in the case of GSM a base station, by means of which connection the base station provides information about when information is being transmitted or is intended to be transmitted in the RF signal.

The invention is not limited to the embodiments described above, but can be freely varied within the scope of the following patent claims.

It is, for example, possible to use the invention in other applications in which there are phase-controlled antennas, for example radar applications.

The invention can also be used in other applications where there is a need to detect and control the phase of a signal from a particular component, which component does not necessarily need to be a power amplifier.

What is claimed is:

1. Method for phase control of a transmitted signal in a device which is part of a system for electromagnetic signal transmission, in which system the transmitted signal has periods when it contains information and periods when it does not contain information, the method comprising the following steps:

controlling the modulation position of a phase shifter which has a linear and a non-linear range, amplifying power of the signal, detecting unwanted phase shifts in the signal transmitted by the device caused within the power amplification, and detecting the information content of the signal, wherein the phase shifter is reset to a certain predetermined modulation position upon detection of absence of information in the signal.

2. Method according to claim 1, wherein the predetermined modulation position to which the phase shifter is reset lies within the linear range of the phase shifter.

3. Method according to claim 1, wherein detection of the fact that the power of the signal has dropped below a certain predetermined level is interpreted as the absence of information in the signal.

4. Method according to claim 1, wherein the predetermined modulation position to which the phase shifter is reset has a least distance to the limits of the phase shifter's linear range which exceeds the phase variation which the power amplifier of the signal is calculated to have during the interval of time which remains until the next resetting of the phase shifter.

5. Method according to claim 1, wherein the modulation position of the phase shifter after resetting is allowed to vary up until a time when the power amplification of the signal does not show any significant phase variations, after which time the modulation position of the phase shifter is kept constant until the next resetting of the phase shifter.

6. Method according to claim 5, wherein the time up to which the modulation position of the phase shifter is allowed to vary after resetting is a time before the guard time in a GSM system ends.

7. Method according to claim 1, wherein the setting comprises the phase shifter being kept constant immediately after the resetting, until the power of the signal has reached a particular predetermined level.

8. Method according to claim 1, wherein the periods when the signal does not contain information are the guard time in a burst in a GSM system.

9. Method according to claim 1, wherein the system in which the method is used is a GSM system, and the device in which the method is used is a base station in a GSM system.

10. Method according to claim 1, wherein the steps are performed in a radar system.

11. Device for controlling a phase of transmitted signal in a system for electromagnetic signal transmission, in which a system the transmitted signal has periods when it contains information and periods when it does not contains information, the device comprising:

a phase shifter with a linear and a non-linear range, a power amplifier, means for the detection of unwanted phase shifts in the signal transmitted by the device caused within the power amplifier, means for controlling the modulation level of the phase shifter, and means for detection of the information content of the signal, wherein the means for controlling the phase shifter resets the phase shifter to a certain predetermined modulation position upon detection of absence of information in the signal.

12. Device according to claim 11, wherein the predetermined modulation position to which the phase shifter is reset lies within the linear range of the phase shifter.

* * * * *